(12) United States Patent
Zeng

(10) Patent No.: US 9,490,786 B2
(45) Date of Patent: Nov. 8, 2016

(54) DRIVER CIRCUIT WITH GATE CLAMP SUPPORTING STRESS TESTING

(71) Applicant: STMicroelectronics (Shenzhen) R&D Co. Ltd, Shenzhen (CN)

(72) Inventor: Ni Zeng, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 0 days.

(21) Appl. No.: 15/088,898

(22) Filed: Apr. 1, 2016

(65) Prior Publication Data

US 2016/0218700 A1    Jul. 28, 2016

Related U.S. Application Data

(63) Continuation of application No. 14/449,232, filed on Aug. 1, 2014, now Pat. No. 9,331,672.

(30) Foreign Application Priority Data

Jun. 30, 2014   (CN) .......................... 2014 1 0320669
Jun. 30, 2014   (CN) ..................... 2014 2 0371939 U

(51) Int. Cl.
| | | |
|---|---|---|
| H03B 1/00 | (2006.01) | |
| H03K 3/00 | (2006.01) | |
| H03K 5/08 | (2006.01) | |
| H03K 17/687 | (2006.01) | |

(52) U.S. Cl.
CPC .............. *H03K 5/08* (2013.01); *H03K 17/687* (2013.01)

(58) Field of Classification Search
CPC .................... H03K 17/04126; H03K 17/063; G01R 31/2884; G01R 31/3004; G01R 31/2621; G01R 31/275
USPC ............. 327/108–112, 538, 543; 326/82, 83; 324/750.3, 762.09
See application file for complete search history.

(56) References Cited

U.S. PATENT DOCUMENTS

| | | | | |
|---|---|---|---|---|
| 2008/0122475 A1* | 5/2008 | Atrash | ............... | G01R 31/2621 324/750.3 |
| 2008/0192390 A1* | 8/2008 | Yoshida | ............. | G01R 31/2879 361/18 |
| 2012/0306528 A1* | 12/2012 | Heinisch | ................. | H01L 22/14 324/762.08 |

* cited by examiner

*Primary Examiner* — Lincoln Donovan
*Assistant Examiner* — Thomas Skibinski
(74) *Attorney, Agent, or Firm* — Gardere Wynne Sewell LLP

(57) ABSTRACT

A generator circuit is coupled to apply a control signal to the gate terminal of a power transistor driving an output node. A reference voltage is generated having a first voltage value as the reference for the control signal and having a second, higher, voltage value for use in stress testing. A clamping circuit is provided between the reference voltage and the power transistor gate to function in two modes. In one mode, the clamping circuit applies a first clamp voltage to clamp the voltage at the gate of the power transistor when the generator circuit is applying the control signal. In another mode, the clamping circuit applies a second, higher, clamp voltage to clamp the gate of the power transistor during gate stress testing.

15 Claims, 2 Drawing Sheets

US 9,490,786 B2

DRIVER CIRCUIT WITH GATE CLAMP SUPPORTING STRESS TESTING

CROSS REFERENCE TO RELATED APPLICATIONS

This application is a continuation of United States Application for U.S. patent Ser. No. 14/449,232 filed Aug. 1, 2014 which claims priority to Chinese Application for Patent Nos. 201410320669.9 and 201420371939.4 both filed Jun. 30, 2014, the disclosures of which are incorporated by reference.

TECHNICAL FIELD

This disclosure relates generally to electronic circuits, and more particularly to driver circuits.

BACKGROUND

Those skilled in the art are familiar with the design and implementation of driver circuits utilizing an NMOS power transistor in a high-side driver, low-side driver or half-bridge driver topology. For example, in a high-side implementation, the drain terminal of the NMOS power transistor is coupled to a supply voltage node and the source terminal of the NMOS power transistor is coupled to an output node to be driven. The gate terminal of the NMOS power transistor is coupled to receive a gate control signal whose voltage level controls the degree to which the NMOS transistor is turned on or off.

A number of common design requests are associated with the design of driver circuits such as: a) ensuring the lowest on-resistance for the NMOS transistor, the gate control signal needs to have a high voltage and it is desired that the voltage be accurate; b) in some dedicated applications, such as with the half-bridge topology applied as a motor driver, there may exist a need to limit the current at the output node; c) providing a built-in gate stress circuit to ensure robust operation of the driver circuit; d) controlling the gate-to-source voltage of the NMOS transistor needs in some conditions (such as with fast transients) use of a clamp circuit; and e) ensuring that the clamp circuit does not impact the gate stress test.

Addressing all of the foregoing common design requests has proven to be a difficult chore for the circuit designer. For example, if the circuit designer uses an inaccurate gate clamp, the clamp voltage will exhibit a wide operating voltage range due to temperature and process corner variation. Indeed, in some cases the variation may overlap into normal working range for the driver circuit and may extend past the absolute maximum rating (AMR) of the transistor device. If the designer instead chooses an accurate gate clamp, the circuit design becomes overly complex due, in part, to a need for implementing extra circuitry with extra bias current on the output. Still further, complex circuits are required to disconnect driver control circuitry from the gate terminal of the NMOS transistor and further to disconnect the clamp circuit during stress testing.

There is accordingly a need in the art for a driver circuit utilizing an NMOS power transistor with a gate clamp supporting both gate protection (clamp) during normal working mode and gate stress testing mode.

SUMMARY

In an embodiment, a circuit comprises: a generator circuit configured to receive a reference voltage at a reference node and output a control signal for application to a gate terminal of a power transistor; a first current source configured to generate a first current for application to said reference node; a second current source configured to generate a second current; a switching circuit configured to selectively couple the second current to said reference node in response to a gate stress test enable signal; a first resistor coupled between the reference node and a drive node of the power transistor across which the reference voltage is generated; wherein said reference voltage is variable having a lower value as a function of the first current when stress test is not enabled and having a higher value as a function of the first and second currents when gate stress test is enabled; and a clamp circuit coupled between said reference node and the gate terminal of the power transistor and configured to apply a clamp voltage as a function of the reference voltage.

In an embodiment, a circuit comprises: a generator circuit configured to receive a reference voltage at a reference node and output a control signal for application to a gate terminal of a power transistor configured to drive an output node; a first transistor; a second transistor; wherein source-drain paths of said first and second transistors are coupled in series between said reference node and the gate terminal of the power transistor; a third transistor coupled with the second transistor to form a current mirroring circuit; and a fourth transistor having a source-drain path coupled between the gate terminal of the power transistor and the output node and a gate terminal coupled to an output of the current mirroring circuit.

In an embodiment, a drive circuit for a power transistor having a gate terminal and an output terminal comprises: a generator circuit configured to apply a drive control signal the gate terminal of the power transistor in order to drive said output terminal; a reference voltage generator configured to generate a reference voltage at a reference node having a first voltage value as the reference for the control signal and having a second, higher, voltage value for use during stress testing; circuitry coupled between the reference node and the gate terminal of the power transistor, said circuitry operable to function as a variable gate clamping circuit exhibiting: a first clamping voltage applied to clamp the voltage at the gate of the power transistor when the generator circuit is applying the control signal; and a second, higher, clamping voltage applied to clamp the voltage at the gate of the power transistor when the generator circuit is disconnected from the gate of the power transistor during gate stress testing mode.

In an embodiment, a circuit coupled to a power transistor having a gate terminal and an output terminal comprises: a clamping circuit coupled between a reference node and the gate terminal of the power transistor, said clamping circuit operable to function as a variable gate clamping circuit exhibiting: a first clamping voltage applied to clamp the voltage at the gate of the power transistor during a normal operation mode of the power transistor; and a second, higher, clamping voltage applied to clamp the voltage at the gate of the power transistor when the generator circuit is disconnected from the gate of the power transistor during a gate stress testing mode.

In an embodiment, a circuit coupled to a power transistor having a gate terminal and an output terminal comprises: a reference node configure to receive a first voltage during a normal operation mode of the power transistor and receive a second voltage during a gate stress testing mode of the power transistor; and a clamping circuit coupled between the reference node and the gate terminal of the power transistor, said clamping circuit comprising: a first transistor having a gate terminal coupled to the gate terminal of the power transistor; a second transistor, wherein source-drain paths of said first and second transistors are coupled in series between said reference node and the gate terminal of the power transistor; a third transistor coupled with the second transistor to the gate terminal of the power transistor to form a current mirroring circuit; and a fourth transistor having a source-drain path coupled between the gate terminal of the power transistor and the output terminal and a gate terminal coupled to an output of the current mirroring circuit.

In an embodiment, a circuit coupled to a power transistor having a gate terminal and an output terminal comprises: a first current source configured to generate a first current for application to a reference node; a second current source configured to generate a second current; a switching circuit configured to selectively couple the second current to said reference node in response to a gate stress test enable signal; wherein a variable reference voltage is generated at said reference node, said variable reference voltage having a lower value as a function of the first current when the gate stress test enable signal is not asserted and having a higher value as a function of the first and second currents when the gate stress test enable signal is asserted; and a clamp circuit coupled between said reference node and the gate terminal of the power transistor and configured to apply a clamp voltage as a function of the variable reference voltage.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Figure 1A:
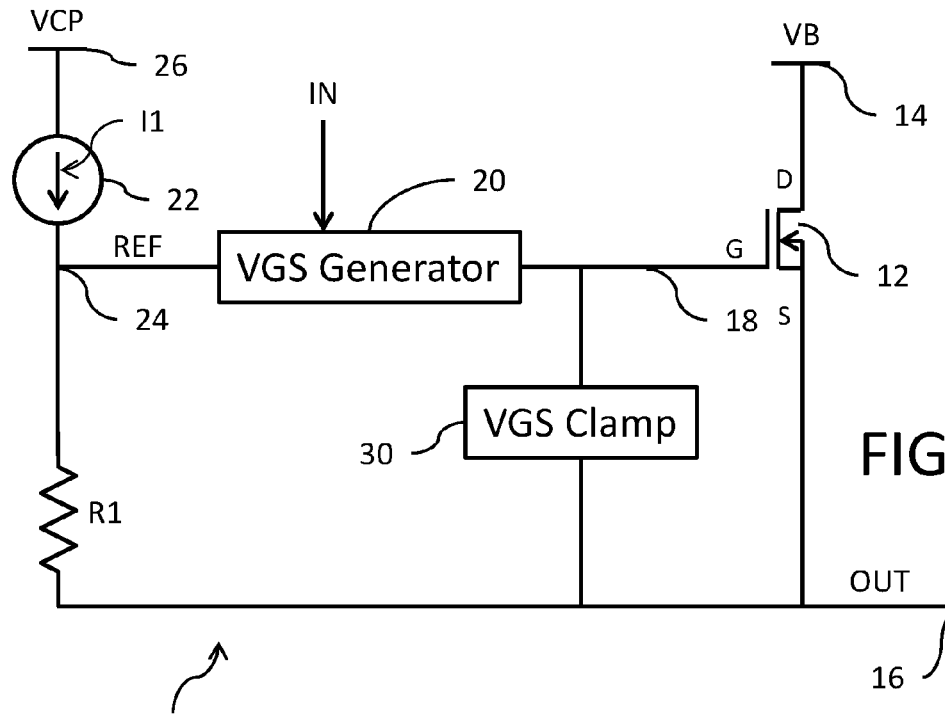
FIG. 1A illustrates the configuration of a driver circuit during normal working mode.

Reference is now made to FIG. 1A which illustrates the configuration of a driver circuit 10 during normal working mode (i.e., when operating to drive a load). The driver circuit 10 comprises an NMOS power transistor 12. The drain (D) terminal of the NMOS power transistor 12 is coupled to a supply voltage node 14 and the source (S) terminal of the NMOS power transistor is coupled to an output node (OUT) 16 to be driven. In the illustrated embodiment, and as an example only without limitation or restriction, the driver circuit 10 is a high-side driver and the supply voltage node 14 is a positive supply voltage VB. The gate (G) terminal of the NMOS power transistor is coupled to a control signal line 18 carrying a gate control signal.

The gate control signal on line 18 is generated by a VGS generator circuit 20. A reference voltage (REF) for operation of the VGS generator circuit is generated by a current source 22 configured to output a fixed reference current I1 applied across a resistor R1. The current source 22 may, for example, generate the fixed reference current I1 as a function of a bandgap voltage (VBG) such that I1=VBG/RBG (RBG comprising the bandgap circuit resistance and VBG=1.25V). The resistor R1 is coupled between the node 24 at which the reference voltage (REF) is generated and the output node 16. The current source 22 is coupled between the node 24 at which the reference voltage (REF) is generated and a supply node 26. In the illustrated embodiment, and as an example only, the supply node 26 is a positive supply voltage VCP generated by a charge pump circuit (not explicitly shown), wherein VCP>VB (for example, VCP=VB+10V), so that the gate control signal output from the VGS generator circuit 20 can exceed the voltage at the drain terminal of the NMOS power transistor 12.

The VGS generator circuit 20 responds to an input signal (IN) and generates the gate control signal having a maximum voltage equal to the reference voltage (REF). A VGS clamp circuit 30 is coupled between the gate terminal and source terminal of the NMOS power transistor 12 and functions to clamp the maximum voltage on the gate terminal to a value which is greater than the reference voltage (REF) but less than the absolute maximum rating (AMR) voltage of the NMOS power transistor 12.

Figure 1B:
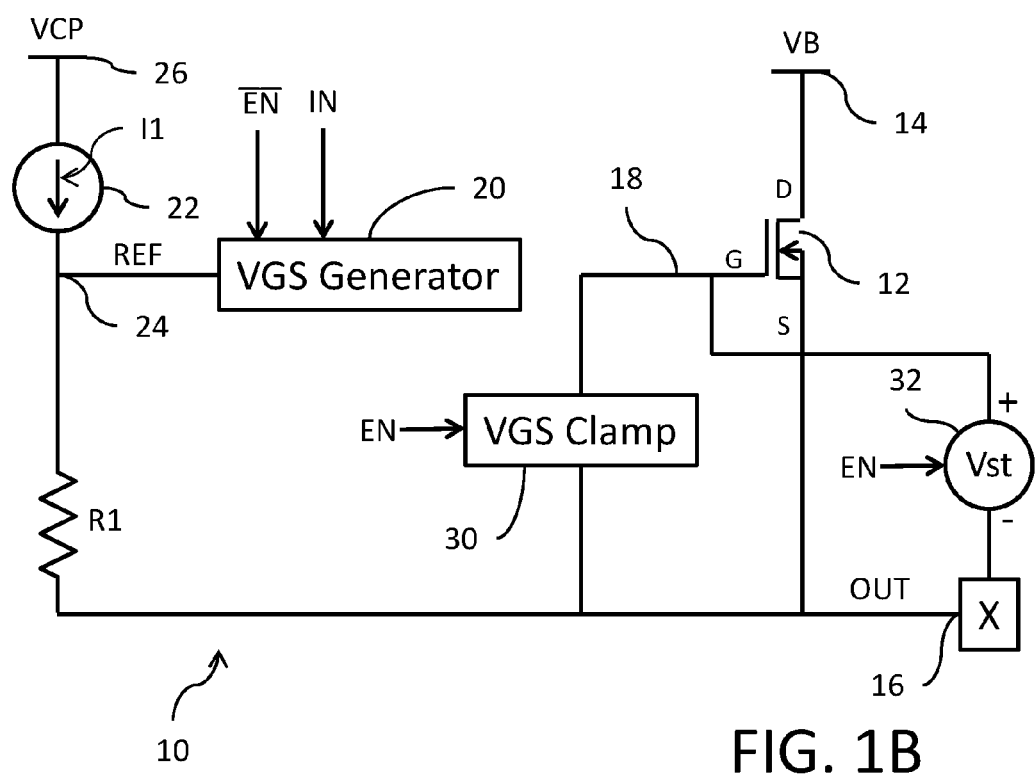
FIG. 1B illustrates the configuration of the driver circuit during gate stress testing mode.

Reference is now made to FIG. 1B which illustrates the configuration of the driver circuit during gate stress testing mode. The circuit enters stress test mode in response to a stress enable signal (EN) which disconnects the output of the VGS generator circuit 20 from the gate terminal of the NMOS power transistor 12 (in response to the signal EN/bar) so as to leave the gate terminal floating, and connects a stress voltage generator 32 between the floating gate terminal and the source terminal of the NMOS power transistor 12. The voltage generator 32 generates a stress voltage (Vst) applied to stress the floating gate terminal of the NMOS power transistor 12. The stress voltage (Vst) should exceed the reference voltage (REF) and still further should preferably exceed the absolute maximum rating (AMR) voltage of the NMOS power transistor 12. In such a case, the VGS clamp circuit 30 is further responsive to the stress enable signal (EN) by either being disconnected from the floating gate terminal of the NMOS power transistor 12 or alternatively exhibit a clamp voltage in excess of the absolute maximum rating (AMR) voltage.

Figure 2:
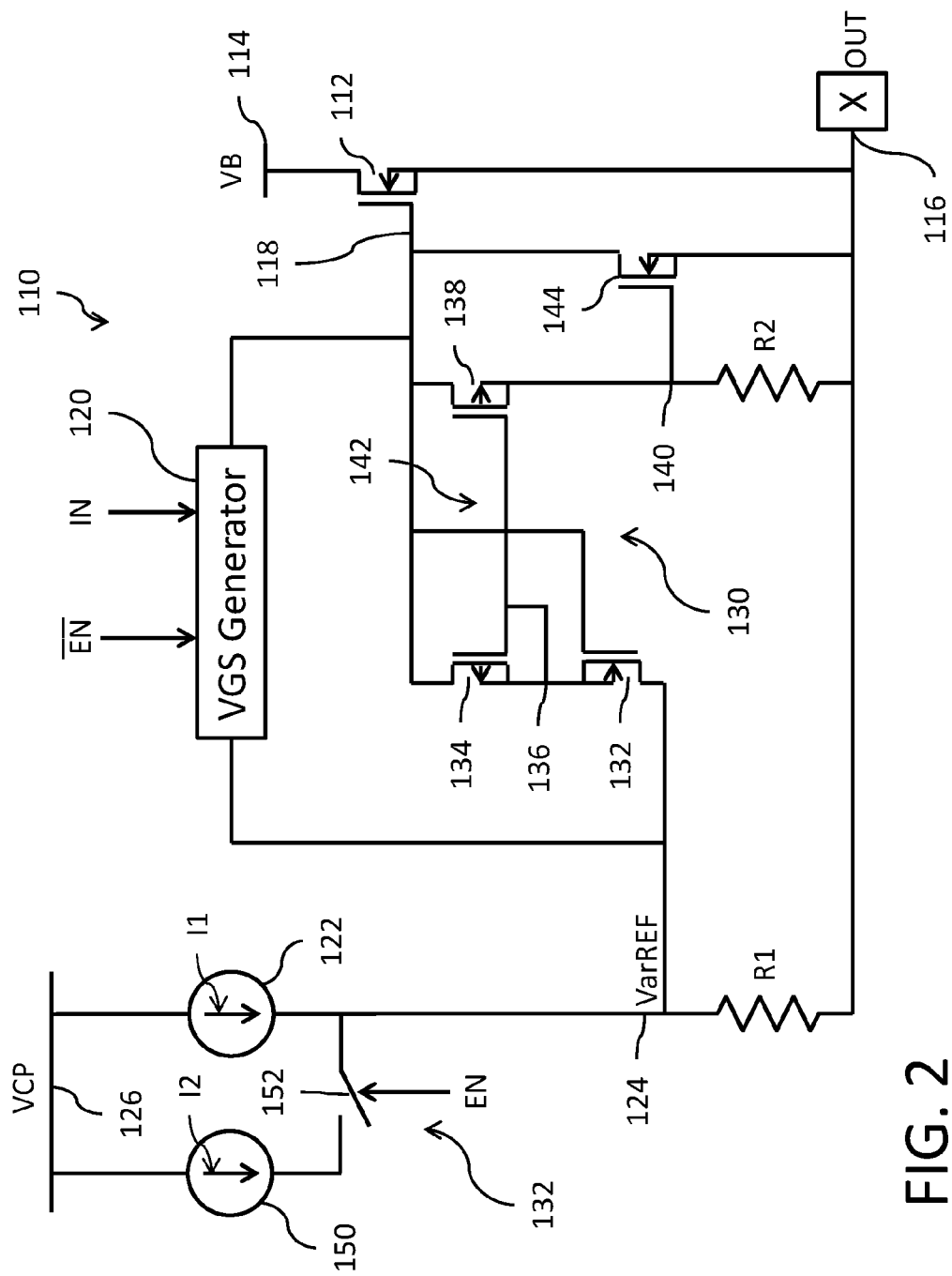
FIG. 2 illustrates a circuit diagram for the driver circuit.

Reference is now made to FIG. 2 which illustrates a circuit diagram for a driver circuit 110. The driver circuit 110 comprises an NMOS power transistor 112. The drain (D) terminal of the NMOS power transistor 112 is coupled to a supply voltage node 114 and the source (S) terminal of the NMOS power transistor is coupled to an output node (OUT) 116 to be driven. In the illustrated embodiment, and as an example only without limitation, the driver circuit 110 is a high-side driver and the supply voltage node 114 is a positive supply voltage VB. The gate (G) terminal of the NMOS power transistor is coupled to a control signal line 118 carrying a gate control signal.

The gate control signal on line 118 is generated by a VGS generator circuit 120. A variable reference voltage (VarREF) having a lower first voltage value (V1) for operation of the VGS generator circuit is generated by a first current source 122 configured to output a fixed reference current I1 applied across a resistor R1. The current source 122 may, for example, generate the fixed reference current I1 as a function of a bandgap voltage (VBG) such that I1=VBG/RBG1 (RBG1 comprising a first bandgap circuit resistance and VBG=1.25V). The resistor R1 is coupled between the node 124 at which the variable reference voltage (VarREF) is generated and the output node 116. The first current source 122 is coupled between the node 124 at which the reference voltage (REF) is generated and a supply node 126. In the illustrated embodiment, and as an example only, the supply node 126 is a positive supply voltage VCP generated by a charge pump circuit (not explicitly shown), wherein VCP>VB (for example, VCP=VB+10V), so that the gate control signal output from the VGS generator circuit 120 can exceed the voltage at the drain terminal of the NMOS power transistor 112.

The VGS generator circuit 120 responds to an input signal (IN) and generates the gate control signal having a maximum voltage equal to the lower first voltage value (V1) of the variable reference voltage (VarREF).

A VGS clamp circuit 130 is coupled between the gate terminal and source terminal of the NMOS power transistor 112 and functions in normal mode to clamp the maximum voltage on the gate terminal to a value which is greater than the reference voltage (REF) but less than the absolute maximum rating (AMR) voltage of the NMOS power transistor 12. The VGS clamp circuit 130 comprises an NMOS transistor 132 and PMOS transistor 134 having source-drain paths coupled in series between the node 124 at which the variable reference voltage (VarREF) is generated and the line 118 at the gate (G) terminal of the NMOS power transistor 112. In this configuration, the sources of the transistors 132 and 134 are coupled together at node 136. The gate terminal of the NMOS transistor 132 is coupled to the line 118 at the gate (G) terminal of the NMOS power transistor 112. The gate terminal of the PMOS transistor 134 is coupled to node 136. In normal operating mode, the transistors 132 and 134 are both turned off and their body diodes (not explicitly shown) prevent current flow between the gate (G) terminal of the NMOS power transistor 112 and the node 124. When functioning as a clamp circuit, however, both transistors 132 and 134 turn on as will be described below.

The VGS clamp circuit 130 further comprises a PMOS transistor 138 whose source-drain path is coupled at node 140 in series with a resistor R2 between the line 118 at the gate (G) terminal of the NMOS power transistor 112 and the output node (OUT) 116. The gate terminal of PMOS transistor 138 is coupled to the gate terminal of the PMOS transistor 134 forming a current mirror circuit 142. The VGS clamp circuit 130 further comprises an NMOS transistor 144 whose drain terminal is coupled to the line 118 at the gate (G) terminal of the NMOS power transistor 112 and whose source terminal is coupled to the output node (OUT) 116. The gate terminal of NMOS transistor 144 is coupled to node 140.

The driver circuit 110 further comprises a gate stress test circuit 132 including a second current source 150 configured to output a fixed reference current I2. The current source 150 may, for example, generate the fixed reference current I2 as a function of a bandgap voltage (VBG) such that I2=VBG/RBG2 (RBG2 comprising a second bandgap circuit resistance and VBG=1.25V). A switch circuit 152 is coupled between the output of the second current source 150 and the node 124 at which the variable reference voltage (VarREF) is generated. The switch circuit 152 is controlled by a stress enable signal (EN) which selectively connects the current I2 to be summed with the current I1 at node 124 for application across the resistor R1 to generate a higher second voltage value (V2) for the variable reference voltage (VarREF) during stress test mode.

In normal working mode for the driver circuit 110 when the stress enable signal (EN) is, for example, logic low, the switch circuit 152 is open and only the current I1 is applied at node 124 across the resistor R1 to generate the variable reference voltage (VarREF) equal to the lower first voltage value (V1) wherein:

$$V_{VarREF} = V1$$
$$= V_{OUT} + I1 * R1$$
$$= V_{OUT} + VBG * \frac{R1}{RBG1}$$

The VGS clamp circuit 130 exhibits a clamp voltage VClamp as a function of the transistors 132 and 134 in accordance with the following equation:

$$VClamp = VBG * \frac{R1}{RBG1} + V_{GS(134)} + V_{DS(132)}$$

The drain-to-source voltage can be made very small by adjusting the size of transistor 132. The voltage VBG is stable. So, the magnitude of the clamp voltage VClamp is primarily impacted by the gate-to-source voltage of transistor 134 and the scaling (R1/RBG1) applied to the bandgap voltage VBG.

When the gate-to-source voltage ($V_G$–$V_{OUT}$) of the NMOS power transistor 112 is less than VClamp, transistors 132, 134, 138 and 144 are turned off. The parasitic body diodes associated with the transistors 132 and 134 function to block current from flowing from node 124 to the line 118 at the gate (G) terminal of the NMOS power transistor 112. The VGS clamp circuit 130 accordingly does not impact the gate (G) terminal of the NMOS power transistor 112 and further does not inject current into the output node (OUT) 116.

However, when the gate-to-source voltage ($V_G$–$V_{OUT}$) of the NMOS power transistor 112 exceeds VClamp, current flows from the line 118 at the gate (G) terminal of the NMOS power transistor 112 towards node 124 through transistors 132 and 134. This current is mirrored by the current mirror 142 through transistor 138 and applied across resistor R2 increasing the voltage at node 140. When the voltage drop across resistor R2 rises to a sufficient level, transistor 144 turns on pulling down on the gate (G) terminal of the NMOS power transistor 112. The voltage at the gate (G) terminal of the NMOS power transistor 112 is accordingly clamped to the lower first voltage value (V1). In an embodiment, the resistor R2 has a very high value (for example, ~Mohm).

In gate stress testing mode for the driver circuit 110 when the stress enable signal (EN) is, for example, logic high, the switch circuit 152 is closed and both the current I1 and the current I2 are applied at node 124 across the resistor R1 to generate the variable reference voltage (VarREF) equal to the higher second voltage value (V2) wherein:

$$V_{VarREF} = V2$$
$$= V_{OUT} + (I1 + I2)R1$$
$$= V_{OUT} + VBG * R1\left(\frac{1}{RBG1} + \frac{1}{RBG2}\right)$$

The logic high stress enable signal (EN) disconnects the output of the VGS generator circuit 120 from the gate terminal of the NMOS power transistor 112 (in response to the signal EN/bar) so as to leave the gate terminal of transistor 112 floating. At this point, a stress test voltage may be applied to the gate terminal using a stress test voltage source (see, for example, reference 32 in FIG. 1B). The variable reference voltage (VarREF) at the higher second voltage value (V2) serves to raise the voltage on the other side of the clamp circuit 130 and increase the VClamp voltage. This ensures that the clamp circuit does not undesirably turn on when the stress test voltage (Vst) is applied by source 32 the gate terminal of transistor 112.

If the gate-to-source voltage ($V_G$-$V_{OUT}$) of the NMOS power transistor 112 is less than the increased VClamp level, there is no current on the gate terminal of transistor 112 and thus the clamp circuit 130 has no impact on the gate stress testing mode.

If the gate-to-source voltage ($V_G$-$V_{OUT}$) of the NMOS power transistor 112 exceeds the increased VClamp level, then current flows from the gate terminal of transistor 112 to node 124 through the transistors 134 and 144 to clamp the gate voltage to the increased VClamp level in spite of the applied stress test voltage.

The driver circuit presents a number of advantages: a) the circuit merges reference and clamp together to decrease the current on the output as only one current path for the reference voltage is present; b) the clamp related to node 124 has enough accuracy for all cases of AMR, gate-to-source voltage, gate stress test and normal working with transistors 132 and 134 providing isolation through two back-to-back diodes so that the clamp circuit is only active when the gate voltage exceeds the variable reference voltage (VarREF) and further has no impact on normal working; c) the circuit operates in gate stress testing by increasing the bias on node 124 to improve the clamp level to a desired value while avoiding disconnection circuit configurations; d) the MOSFET devices (132, 134, 138) of the circuit do not need extra protection on gate-to-source voltage (they are self-protected).

Those skilled in the art will note that two loops are present when the clamp circuit is activated. There is a negative feedback loop with current from the gate terminal of transistor 122 to the output node 116 via transistors 138 and 144 and resistor R2. There is also a positive feedback loop with current from the gate of transistor 112 to node 124 which will increase the voltage at node 124 and thus increase the clamp voltage level. The positive feedback current conducts before the negative feedback current. With proper setting of the values for resistor R1 and transistor 144, even a very small positive nA current can produce a several mA pull-down current through transistor 144. The clamp action is strong enough to protect the gate of the power transistor 112.

Although the driver circuit 110 is illustrated in FIG. 2 in an example of a high-side topology, it will be understood that those skilled in the art can implement the design for a low-side topology as well as a half-bridge topology.

It will be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit coupled to a power transistor having a gate terminal and an output terminal, comprising:
   a clamping circuit coupled between a reference node and the gate terminal of the power transistor, said clamping circuit operable to function as a variable gate clamping circuit exhibiting:
   a first clamping voltage applied to clamp the voltage at the gate of the power transistor during a normal operation mode of the power transistor; and
   a second, higher, clamping voltage applied to clamp the voltage at the gate of the power transistor when the generator circuit is disconnected from the gate of the power transistor during a gate stress testing mode.

2. The circuit of claim 1, wherein said clamping circuit comprises:
   a first transistor having a gate terminal coupled to the gate terminal of the power transistor; and
   a second transistor;
   wherein source-drain paths of said first and second transistors are coupled in series between said reference node and the gate terminal of the power transistor.

3. The circuit of claim 2, wherein said clamping circuit further comprises:
   a third transistor coupled with the second transistor to the gate terminal of the power transistor to form a current mirroring circuit; and
   a fourth transistor having a source-drain path coupled between the gate terminal of the power transistor and the output terminal and a gate terminal coupled to an output of the current mirroring circuit.

4. The circuit of claim 1, further comprising a reference voltage generator configured to generate a voltage at said reference node, the reference voltage generator comprising:
   a first current source configured to generate a first current for application to said reference node;
   a second current source configured to generate a second current;
   a switching circuit configured to selectively couple the second current to said reference node in response to a stress test enable signal;
   wherein said voltage comprises: a first voltage value set as a function of the first current the generator circuit during the normal operation mode of the power transistor and a second voltage higher than the first voltage set as a function of the first and second currents during gate stress testing mode.

5. A circuit coupled to a power transistor having a gate terminal and an output terminal, comprising:
   a reference node configure to receive a first voltage during a normal operation mode of the power transistor and receive a second voltage during a gate stress testing mode of the power transistor; and
   a clamping circuit coupled between the reference node and the gate terminal of the power transistor, said clamping circuit comprising:
   a first transistor having a gate terminal coupled to the gate terminal of the power transistor;
   a second transistor, wherein source-drain paths of said first and second transistors are coupled in series between said reference node and the gate terminal of the power transistor;
   a third transistor coupled with the second transistor to the gate terminal of the power transistor to form a current mirroring circuit; and
   a fourth transistor having a source-drain path coupled between the gate terminal of the power transistor and the output terminal and a gate terminal coupled to an output of the current mirroring circuit.

6. The circuit of claim 5, further comprising a resistor coupled between the gate terminal of the fourth transistor and the output terminal.

7. The circuit of claim 5, further comprising a resistor coupled between the reference node and the output terminal.

8. The circuit of claim 5, further comprising a gate-to-source voltage generator circuit coupled to apply a control voltage to the gate terminal of the power transistor during the normal operation mode and is disconnected from the gate terminal of the power transistor during gate stress testing mode.

9. A circuit coupled to a power transistor having a gate terminal and an output terminal, comprising:
   a first current source configured to generate a first current for application to a reference node;
   a second current source configured to generate a second current;
   a switching circuit configured to selectively couple the second current to said reference node in response to a gate stress test enable signal;
   wherein a variable reference voltage is generated at said reference node, said variable reference voltage having a lower value as a function of the first current when the gate stress test enable signal is not asserted and having a higher value as a function of the first and second currents when the gate stress test enable signal is asserted; and
   a clamp circuit coupled between said reference node and the gate terminal of the power transistor and configured to apply a clamp voltage as a function of the variable reference voltage.

10. The circuit of claim 9, wherein said clamp circuit comprises:
    a first transistor; and
    a second transistor, wherein source-drain paths of said first and second transistors are coupled in series between said reference node and the gate terminal of the power transistor.

11. The circuit of claim 10, wherein said clamp circuit further comprises:
    a gate terminal of the first transistor coupled to the gate terminal of the power transistor; and
    a gate terminal of the second transistor coupled to an intermediate node at a series coupling point of the first and second transistors.

12. The circuit of claim 11, wherein the clamp circuit further comprises a third transistor coupled with the second transistor to the gate terminal of the power transistor to form a current mirroring circuit.

13. The circuit of claim 12, wherein the clamp circuit further comprises a resistor coupled in series with a source-drain path of the third transistor between the gate terminal of the power transistor and the output terminal.

14. The circuit of claim 12, wherein the clamp circuit further comprises a fourth transistor having a source-drain path coupled between the gate terminal of the power transistor and the output terminal and a gate terminal coupled to the third transistor.

15. The circuit of claim 9, wherein the clamp voltage is lower when stress test is not enabled and higher when the gate stress test enable signal is asserted.

* * * * *